United States Patent
Fujii et al.

[11] Patent Number: 5,914,597
[45] Date of Patent: Jun. 22, 1999

[54] MULTI-LAYERED MAGNETO-RESISTIVE THIN FILM SENSOR

[75] Inventors: Shigeo Fujii; Shin Noguchi, both of Kumagaya; Noriaki Nakayama, Ube, all of Japan

[73] Assignee: Hitachi Metals, Ltd., Tokyo, Japan

[21] Appl. No.: 08/931,487

[22] Filed: Sep. 16, 1997

[30] Foreign Application Priority Data

Oct. 11, 1996 [JP] Japan .................................. 8-269518

[51] Int. Cl.$^6$ ........................... G01R 33/02; H01L 43/08; G11C 19/08; G11B 5/39
[52] U.S. Cl. ............................................. 324/252; 360/113
[58] Field of Search .................... 324/252; 338/32 R; 360/113, 126

[56] References Cited

U.S. PATENT DOCUMENTS 5,206,590 4/1993 Dieny et al. ............................ 324/252
5,583,725 12/1996 Coffey et al. ........................... 324/252

FOREIGN PATENT DOCUMENTS 4-358310 12/1992 Japan .

*Primary Examiner*—Jay M. Patidar

[57] ABSTRACT

The change rate of resistance in a multi-layered spin-valve magneto-resistive thin film using a FeMn anti-ferromagnetic layer has been improved. In multi-layered magento-resistive thin film having a first ferromagnetic layer, a non-magnetic layer and a second ferromagnetic layer with an adjoining anti-ferromagnetic layer are laminated on a substrate; the magnetizing direction of each ferromagnetic layer lying in the film surface; the magnetizing direction of the second ferromagnetic layer being pinned by the magnetic exchange coupling field generated by the anti-ferromagnetic layer; and the magnetizing direction of the first ferromagnetic layer not being pinned, the degree of dispersion of lattice spacing, or lattice relaxations at the interface of the second ferromagnetic layer and the anti-ferromagnetic layer is set to equal to or less than 0.5 Å.

4 Claims, 12 Drawing Sheets

MULTI-LAYERED MAGNETO-RESISTIVE THIN FILM SENSOR

FIELD OF THE INVENTION

The present invention relates to a multi-layered magneto-resistive thin film applicable to a magnetic sensor, or more specifically a magnetic head or magneto-resistive sensor, for detecting magnetic information from a magnetic recording medium and converting it into electrical information.

DESCRIPTION OF RELATED ART

Magnetic heads have heretofore been widely used as means for converting electrical signals into magnetic signals, record them in a magnetic medium as information, and reproduce the recorded magnetic information as electrical signals. The magnetic heads, when recording information, magnetize a recording medium by generating a magnetic field by exciting a ferromagnetic material of a high permeability by applying electric current to a coil, and when reproducing the recorded information, detect a voltage induced in the coil by magnetic fluxes caused to flow in the ferromagnetic material by a magnetic field produced from the magnetized medium. The magnetic heads of this type include a ferrite head of a metal-in-gap construction, and a thin-film head using a magnetic thin film as a ferromagnetic material, and are generically called the inductive head. These inductive heads, in which reproduction output tends to become smaller with decrease in magnetic field generated by the recording medium, are considered not suitable to meet the recent trend toward higher recording density because with higher recording density, recording bits as units of magnetic information formed on a recording medium are reduced, and accordingly the leakage magnetic field generated by the recording bits is also reduced. To overcome such inconveniences in recent years, magneto-resistive elements having higher playback sensitivity have been increasingly used in the reproduction part of the magnetic head.

As a magneto-resistive element widely used is a Ni—Fe permalloy ferromagnetic film which can achieve a playback sensitivity more than twice as high as the inductive head. In the magneto-resistive element which relies on the property of a permalloy film where electrical resistance varies in accordance with the magnetizing direction, however, the rate of change of electrical resistance which serves as an index for playback sensitivity is on the order of only 2%. More recently, a new multi-layered thin film, called the spin-valve type, has been proposed (Japanese Patent Publication No. Hei-4(1992)-358310, corresponding to U.S. Pat. No. 5,206,590), which relies on electron scattering at the interface of laminated film layers, rather than on the property intrinsic to the material. This spin-valve type thin film is reported to have a magneto-resistive effect several times higher than the aforementioned permalloy element.

The multi-layered thin film has a structure shown in FIG. 2 comprising a first ferromagnetic layer 2 separated by a non-magnetic layer 3, and a second ferromagnetic layer whose magnetizing direction is pinned by an anti-ferromagnetic layer 5. The magnetizing direction of the second ferromagnetic layer 4 is pinned by a magnetic exchange coupling field generated by the anti-ferromagnetic layer 5, and a weak ferromagnetic bonding force is exerted in between the second ferromagnetic layer 4 and the first ferromagnetic layer 2 separated by the non-magnetic layer 3. On the first ferromagnetic layer 2 whose magnetizing direction is not pinned, magnetization is rotated by a small magnetic field ($H_1$) in the direction of applied magnetic field, while a larger magnetic field ($H_2$) is required to rotate the magnetization of the second ferromagnetic layer 4 whose magnetizing direction is pinned. Electrical resistance of the multi-layered thin film remains small when two ferromagnetic layers are in the same magnetizing direction, and increases when the magnetic field is larger than $H_1$ where the magnetizing direction of both layers is in anti-parallel to each other, and smaller than $H_2$. As a magnetic sensor, the multi-layer thin film is aimed at detecting magnetic fields whose polarities vary within a smaller magnetic field range than $H_2$. To achieve this, it is required that the first ferromagnetic layer 2 whose magnetizing direction is not pinned should have excellent soft magnetic properties, such as smaller coercive force, and that the second ferromagnetic layer 4 whose magnetizing direction is pinned should have such a large exchange coupling field generated by the anti-ferromagnetic layer 5 that the second ferromagnetic layer 4 does not respond to the leakage magnetic field from the recording bits formed on the recording medium.

The multi-layered spin-valve type thin film is also increasingly required to have improved sensitivity to magnetic field to meet the recent trend toward higher recording density.

SUMMARY OF THE INVENTION

It is an object of the present invention, in the light of the aforementioned problems, to improve sensitivity, that is, the amount of change in electrical resistance in the multi-layered spin-valve type magneto-resistive thin film.

To accomplish the object, the present invention provides a multi-layered magento-resistive thin film comprising a first ferromagnetic layer and a second ferromagnetic layer laminated via an interposed non-magnetic layer on a substrate; the second ferromagneic layer being laminated with an adjoining antiferromagnetic layer and the magnetizing direction of the second ferromagnetic layer being pinned by a magnetic exchange coupling field produced by the anti-ferromagnetic layer while the first ferromagnetic layer being not pinned, wherein the degree of dispersion α of lattice spacing at the interface of the two layers is equal to or less than 0.5 A with respect to the average value of ½($d_{ferro}$+ $d_{anti-ferro}$), wherein $d_{ferro}$ and $d_{anti-ferro}$ express lattice spacings almost parallel to the surfaces of the second ferromagnetic and the anti-ferromagnetic layers, respectively.

DESCRIPTION OF THE PREFERRED EMBODIMENTS

Figure 1:
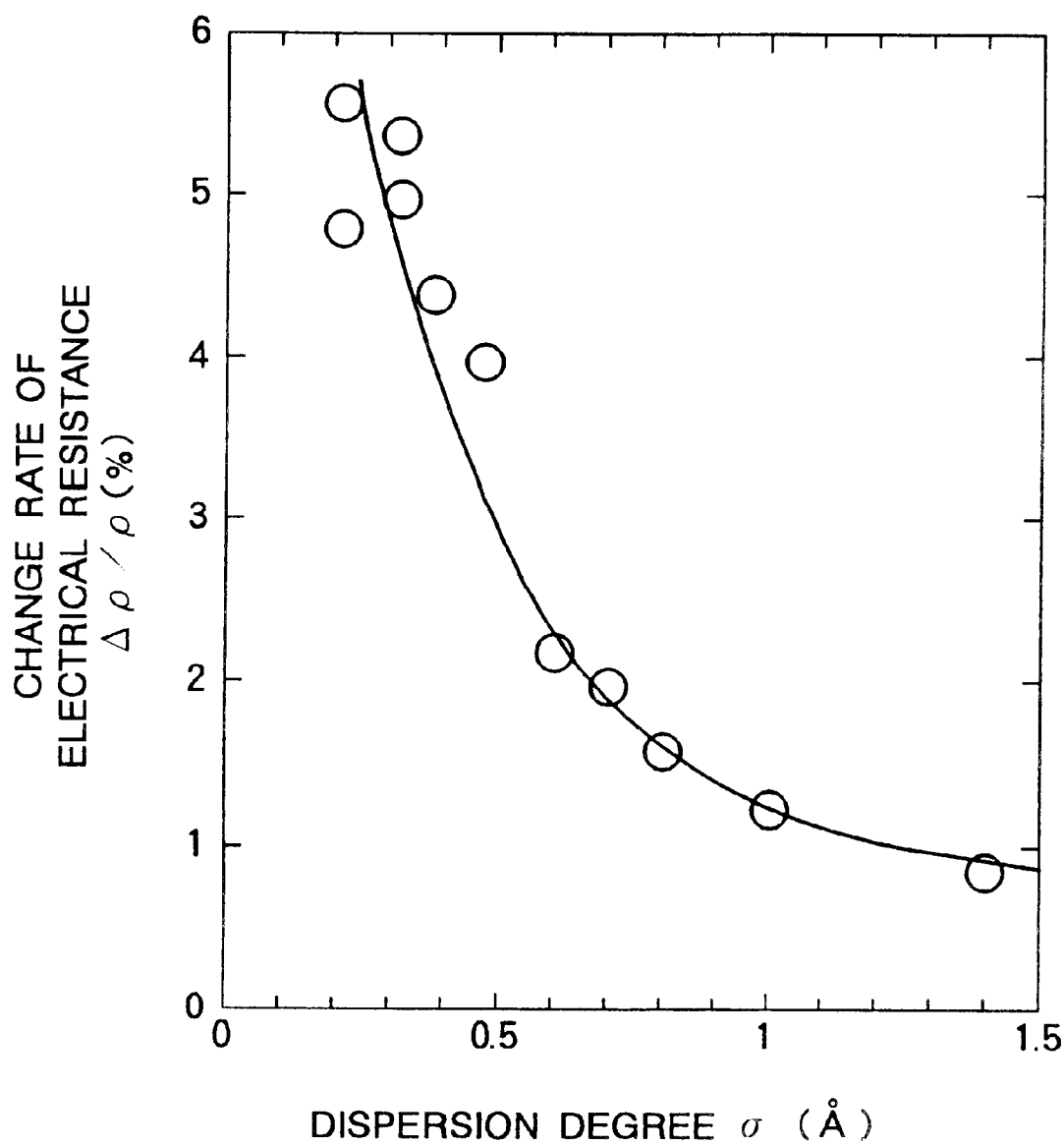
FIG. 1 is a diagram illustrating the relationship between the degree of dispersion, α, of lattice spacing at the interface of the anti-ferromagnetic layer and the ferromagnetic layer and the change rate of electrical resistance, $\Delta\rho/\rho$, due to magnetic field.

In the present invention, the first ferromagnetic layer is preferably a Ni—Fe film formed on an underlayer, and a Co film or an alloy thin film composed chiefly of Co with an equivalent density laminated thereon. Forming a sufficiently thick Ni—Fe film with good soft magnetic properties makes it easy to reverse the magnetization of the first ferromagnetic layer. The second ferromagnetic layer is a Co film or an alloy film composed chiefly of Co with an equivalent density, disposed facing the Co film of the first ferromagnetic layer via a non-magnetic layer, and having a film chiefly containing Ni—Fe formed thereon. The first and second ferromagnetic layers have (111) planes oriented in parallel to the film surfaces thereof On the second ferromagnetic layer provided is an adjoining anti-ferromagnetic layer. The anti-ferromagnetic layer should preferably be such as not to cause changes in crystal structure during manufacturing process, and more preferably be a material composed chiefly of Fe—Mn. Those materials which tend to cause structural changes during heat treatment, such as Ni—Mn, are not suitable for the purpose. In the second ferromagnetic layer, the magnetization of the Ni—Fe layer is pinned by the exchange coupling field generated by the adjoining Fe—Mn anti-ferromagnetic layer.

In the present invention, the surfaces facing each other of the first and second ferromagnetic layers are formed of Co films or alloy films composed chiefly of Co with an equivalent density because these films, which have higher d-electron density and high electron scattering at the interface, can exhibit excellent magneto-resistive properties. The Co film, or Co-based alloy film should be of a face-centered cubic (f.c.c.) structure in view of lattice matching with the adjoining layers.

The non-magnetic layer should preferably be a metal having excellent electron conductivity. Ag, Au and Cu are known as such metals. To ensure effective electron scattering (electron scattering by magnetic moment) at the interface caused by the adjoining metal layer, which is responsible for the magneto-resistive effect, however, it is necessary to prevent electron scattering due to the roughness of the interface, and therefore to keep the surface of the non-magnetic layer smooth. To this end, an alloy composed chiefly of Cu is most recommendable.

In a multi-layered spin-valve type magneto-resistive thin film using an anti-ferromagnetic layer chiefly containing Fe—Mn, the second ferromagnetic layer and the anti-ferromagnetic layers are formed continuously. When a film is formed by atoms arranged orderly in steps, an ideal interface is realized. That is, when lattice spacings almost parallel to the film surfaces of the second ferromagnetic layer and the anti-ferromagnetic layer are defined as $d_{ferro}$ and $d_{anti-ferro}$, respectively, the lattice spacing at the interface at which the two layers adjoin each other is ideally $\frac{1}{2}(d_{ferro}+d_{anti-ferro})$. When a disturbance exists at the interface due to lattice mismatch or atomic diffusion on each layer, however, the lattice spacing in the vicinity of the interface deviates from the ideal lattice spacing. Assume that this deviation is a change only in lattice spacing at the interface, and that a difference between the actual lattice spacing and the ideal lattice spacing exists with the degree of dispersion of $\alpha$.

The inventors have found that the degree of dispersion, $\alpha$, has a close relationship with the change rate of electrical resistance due to magnetizing, $\Delta\rho/\rho$. That is, the degree of dispersion, $\alpha$, must be set to a small value in order to obtain a high change rate of electrical resistance, $\Delta\rho/\rho$, so as to impart to a multi-layered spin-valve type magneto-resistive thin film a sensitivity over 3%, far exceeding the change rate of electrical resistance for a typical Ni—Fe thin film exhibiting an anisotropic magneto-resistive effect.

When there is a great degree of dispersion in lattice spacing due to the existence of disturbance in the interface between the second ferromagnetic layer and the anti-ferromagnetic layer, the magnetization of the second ferromagnetic layer is oriented in one direction as a whole, but is not uniform in microscopic terms. For this reason, it is considered that even when the magnetization of the first ferromagnetic layer is parallel/anti-parallel to the magnetization of the second ferromagnetic layer on application of an external magnetic field, the difference between the electrical resistance when the magnetization is parallel and the electrical resistance when the magnetization is anti-parallel, that is, the amount of change in resistance, $\Delta\rho$, becomes smaller because of the existence of partial disturbance.

The degree of dispersion, $\alpha$, can be calculated easily by directly observing lattice spacing with appropriate means such as an electron microscope, or with the X-ray diffraction method.

Figure 3:
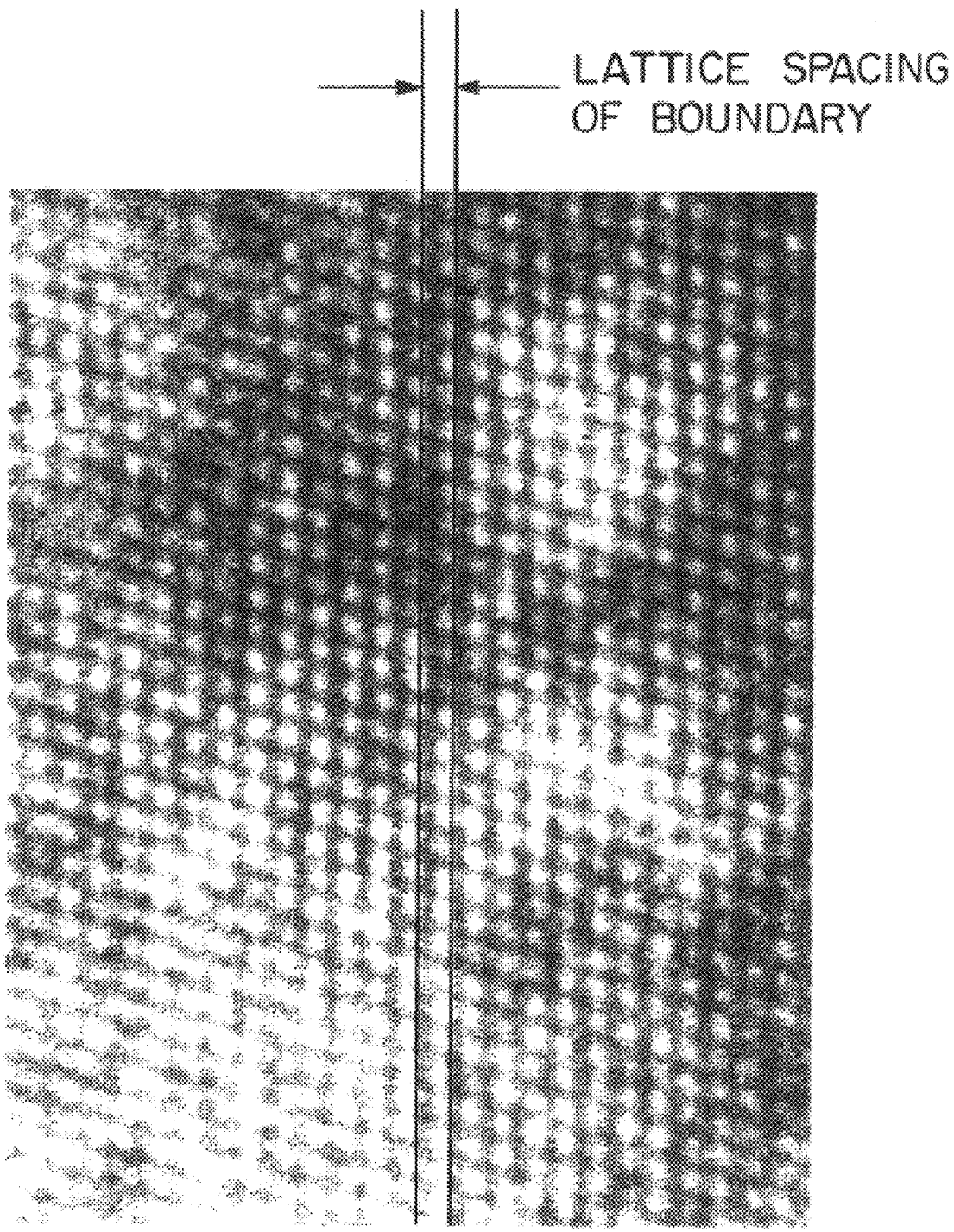
FIG. 3 is a photograph showing lattice spacing at the interface of two layers obtained through observation of the cross-section of the multi-layered thin film by an electron microscope.

A lattice spacing at the interface between the second ferromagnetic layer and the anti-ferromagnetic layer can be magnified with a transmission electron microscope and photographed. When the image obtained is processed photographically to a magnification of approximately 10 million–30 million, the size of a lattice spacing becomes 2 mm–7 mm. The degree of dispersion, $\alpha$, can be obtained by observing trains of 30–50 atoms in the interface, as shown in FIG. 3, measuring the lattice spacing in the interface, and subjecting more than 20 measurements to statistical processing. FIG. 3 is a photograph of the boundary layer between Fe—Mn and Ni—Fe layers, magnified 15 million times by a transmission microscope. Since the lattice spacing is 3.3 mm on the photograph, the actual plane distance is 2.2 Å.

Figure 4A:
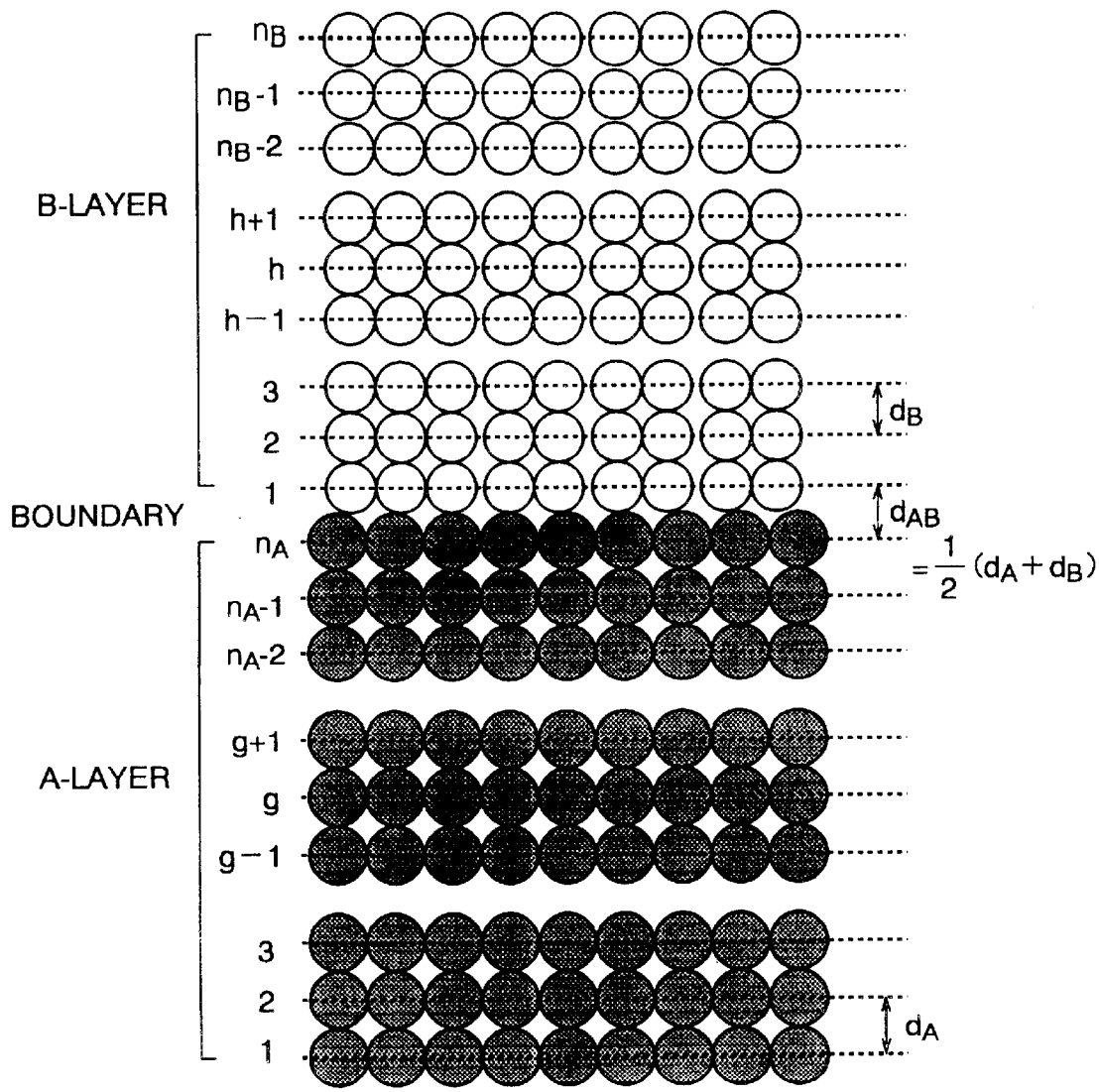
FIG. 4 is a schematic diagram of assistance in explaining lattice spacing at the interface of two layers; (a) being the case where atoms are arranged orderly at the interface, and (b) being the case where some disturbance occurs in atoms at the interface.
Figure 4B:
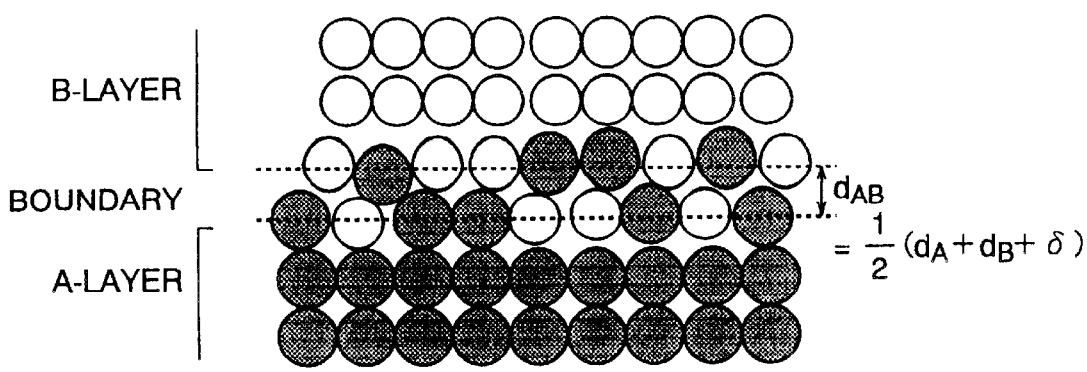

The X-ray diffraction method is a suitable nondestructive examination method when the specimen is of a size sufficient for X-ray diffraction. Now, consider a two-layered thin film consisting of A and B layers adjoining each other, with lattice planes formed by atoms orderly arranged in steps, as shown in FIG. 4 (a). Assume that the A and B layers consist of $n_A$ and $n_B$ pieces of lattice planes, with lattice spacings being $d_A$ and $d_B$. With the lattice spacing on the interface being expressed as $d_{AB}$, the locations, $z_g$ and $z_h$, of the atom planes in the A and B layers can be expressed by the following equations.

$$z_g = (g-1)d_A \tag{1}$$

$$z_h = (h-1)d_B + (n_A-1)d_A + d_{AB} \tag{2}$$

Scattering amplitude A(Q)(Q: scattering vector) is $$A(Q) = f_A \eta_A \sum_{g=1}^{n_A} \exp\{iQ(g-1)d_A\} + \tag{3}$$

$$f_B \eta_B \exp\{iQ(n_A d_A - d_A + d_{AB})\} \sum_{h=1}^{n_B} \exp\{iQ(h-1)d_B\}$$

where $f_{78}$ is the atom scattering factor ($f_\kappa = f_\kappa(Q) + \Delta f_\kappa' + i\Delta f_\kappa''$), and $\eta_\kappa$ is the atom density per lattice plane.

The intensity I(Q) can therefore be expressed by the following equation.

$$I(Q) = f_A^2 \eta_A^2 \cdot \sin^2(n_A Q d_A/2)/\sin^2(Q d_A/2) + \tag{4}$$

$$f_B^2 \eta_B^2 \cdot \sin^2(n_B Q d_B/2)/\sin^2(Q d_B/2) + f_A \eta_A f_B$$

$$\eta_B \cdot \sin(n_A Q d_A/2)/\sin(Q d_A/2) \cdot \sin(n_B Q d_B/2)/\sin(Q d_B/2) \cdot \cos$$

$$\{Q(n_A d_A + n_B d_B - d_A - d_B + d_{AB})/2\}$$

In Equation (4), the preceding two terms mean the scattering intensity from the individual A and B layers, and the third term is the interference term. The lattice spacing $d_{AB}$ at the interface is $d_{AB} = \frac{1}{2}(d_A + d_B)$ in the ideal state where there is no atomic scatter in the two layers, but actually there exists lattice relaxation, as shown in FIG. 4 (b). The amount of lattice relaxation, $\delta$, can be calculated by considering $d_{AB}$ having dispersion, $\alpha$, in Equation (4).

Figure 5:
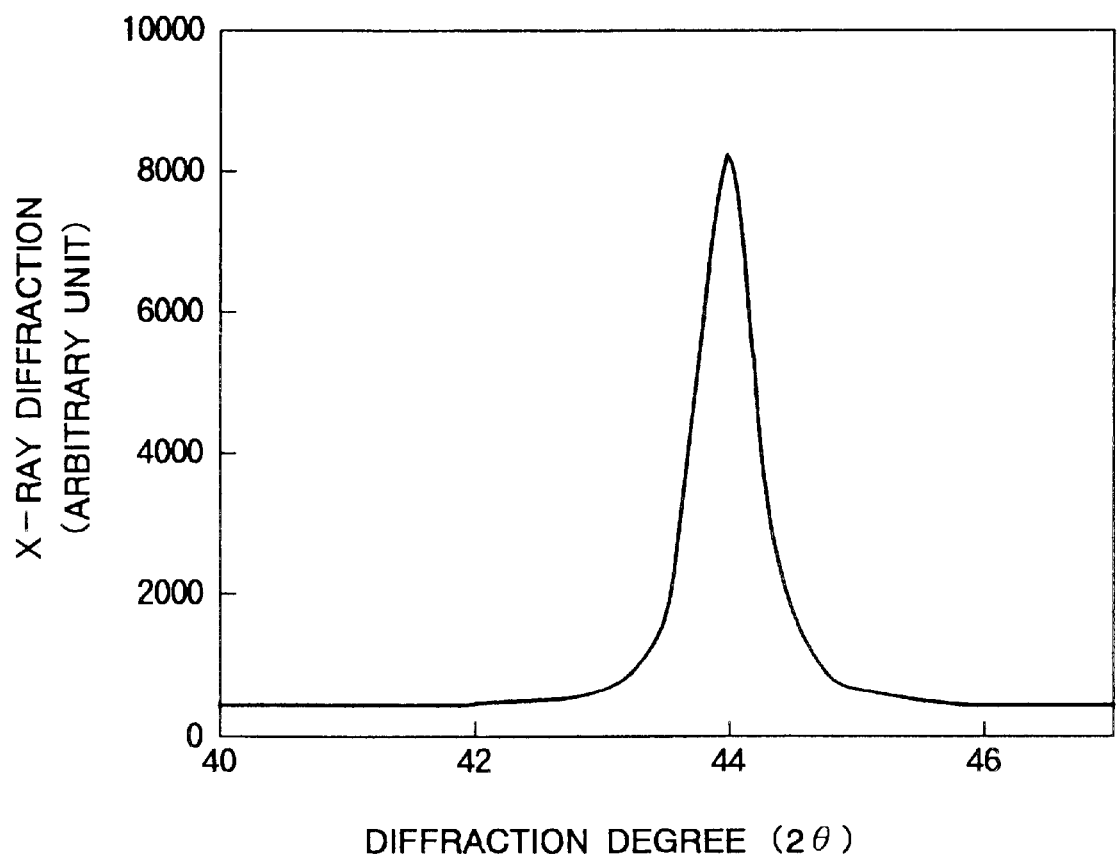
FIG. 5 is a diagram illustrating the X-ray diffraction profile of a specimen where a 5 nm-thick Ta film and a 10 nm-thick Co film were continuously formed on a substrate.
Figure 6:
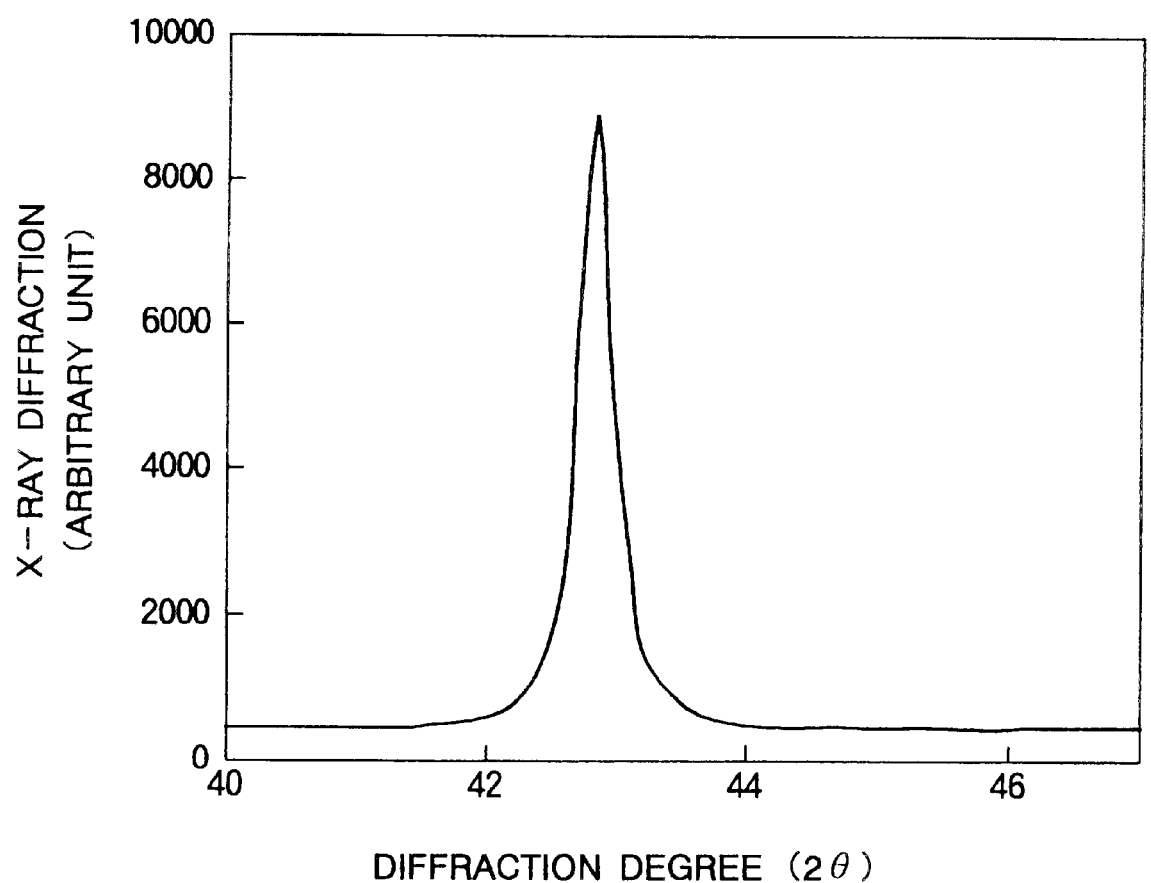
FIG. 6 is a diagram illustrating the X-ray diffraction profile of a specimen where a 5 nm-thick Ta film and a 10 nm-thick FeMn film were continuously formed on a substrate.
Figure 7:
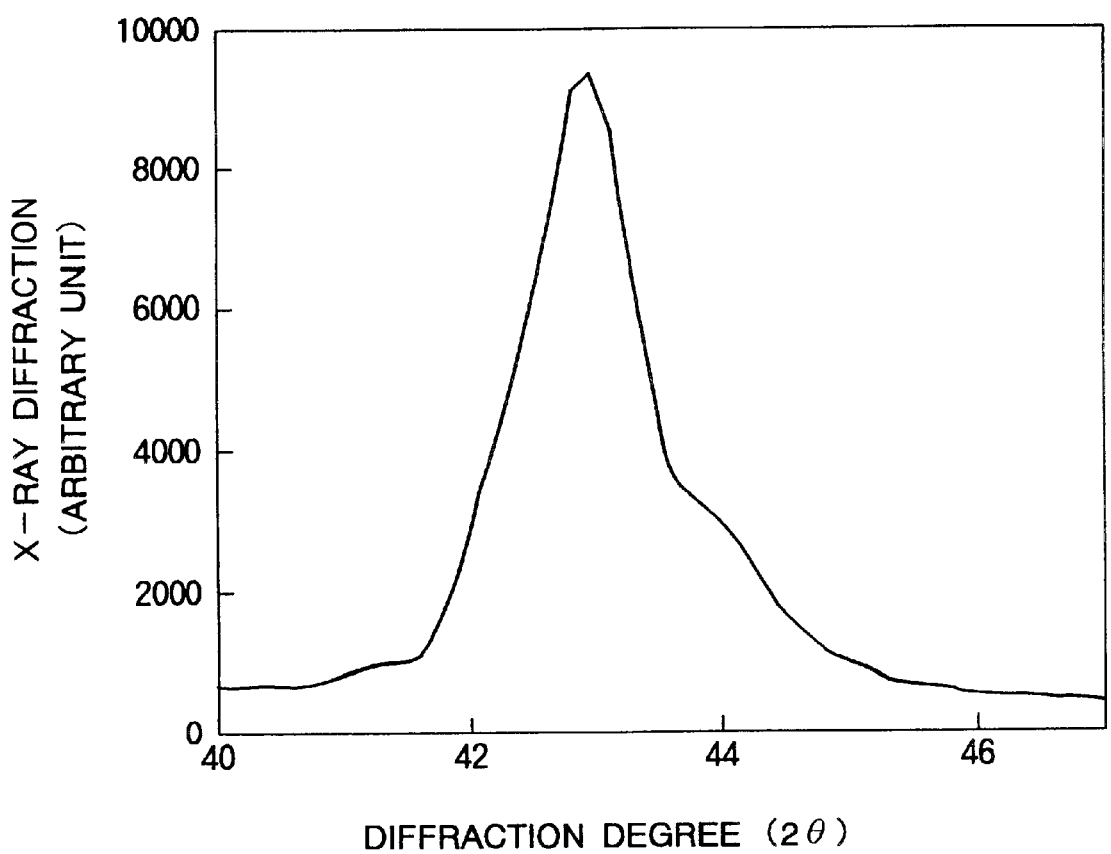
FIG. 7 is a diagram illustrating the X-ray diffraction profile of a specimen where a 5 nm-thick Ta film, a 10 nm-thick Co film and a 10 nm-thick FeMn film were continuously formed on a substrate.
Figure 8:
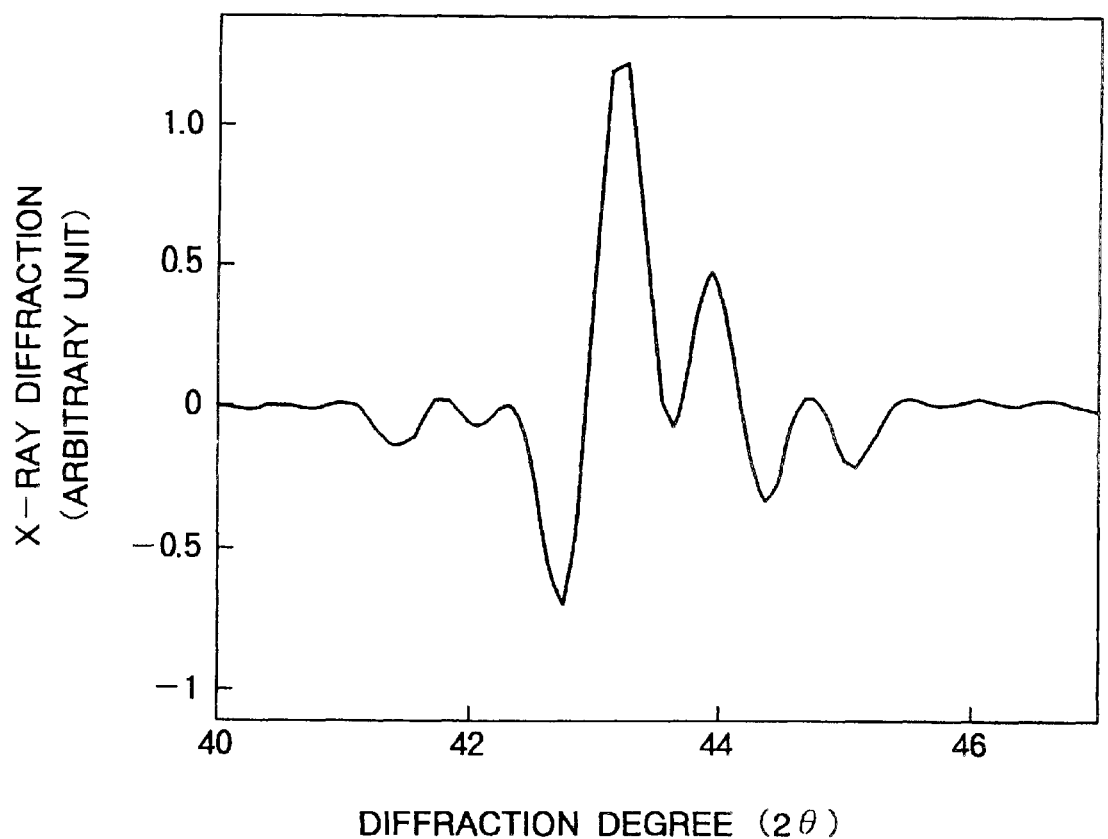
FIG. 8 is a diagram illustrating the calculated results of interference term in the X-ray diffraction intensity of a specimen having the ideal interface where a 10 nm-thick Co film and a 10 nm-thick FeMn film were continuously formed.

FIGS. 5 and 6 show X-ray diffraction profiles of a Co ferromagnetic film and an $Fe_{50}$—$Mn_{50}$ (atomic %) anti-ferromagnetic film, each of a 10 nm thickness, formed on a 5 nm-thick Ta underlayer, respectively. The Ta layer, which is in an amorphous state, does not exhibit diffraction reflection, while the Co ferromagnetic and the $Fe_{50}$—$Mn_{50}$ anti-ferromagnetic films, both of an f.c.c. structure, show an X-ray diffraction profile showing that the (111) plane is intensely oriented. FIG. 7 is an X-ray diffraction profile of 10 nm-thick Co and Fe—Mn films continuously formed on a 5 nm-thick Ta underlayer. The figure does not represent a mere superposition of the two diffraction peaks belonging to Co and $Fe_{50}$—$Mn_{50}$, but it indicates that diffraction peaks appear almost in the middle of the two peaks. A main peak appears at a location corresponding to the average plane spacing of the atom planes in the film, with some sub-peaks in the vicinity thereof, as a result of interference of the diffraction waves caused by the atom planes in the two layers. The diffraction profile including the effects of the interference can be calculated as follows. First, the interference term given by the third term of Equation (4) is as shown in FIG. 8. The diffraction profile of a single-layer film each of Co and $Fe_{50}$—$Mn_{50}$ films as shown in FIGS. 5 and 6 can be obtained from the first and second terms of Equation (4). Consequently, an X-ray diffraction profile taking into account the effects of interference can be obtained by combining these three diffraction profiles. The profile taking into consideration lattice relaxations in the interface can be obtained by calculating 50 interference diffractions having a certain degree of dispersion, $\alpha$, for example, and averaging the calculated results. Theoretical profiles corresponding to various $\alpha$ values are obtained, compared with the diffraction profiles of actual specimens, and the value of the degree of dispersion, $\alpha$, is obtained from the comparison results where the best matching was reached.

In the present invention, the change rate of electrical resistance, $\Delta\rho/\rho$, caused by magnetizing can be achieved to more than 3% by setting the degree of dispersion, $\alpha$, in the aforementioned interface to equal to or less than 0.5 Å. With $\alpha$ being more than 0.6 Å, no sufficient change rate of electrical resistance, $\Delta\rho/\rho$, caused by magnetizing cannot be obtained.

In the following, the present invention will be described, referring to an embodiment.

An ion beam sputtering apparatus used to prepare the multi-layered magneto-resistive thin film according to this invention had in the same vacuum chamber a plurality of targets required for forming a multi-layered thin film and a glass substrate on which the multi-layered thin film was deposited; an ion gun disposed facing the targets, and an auxiliary ion gun disposed facing the glass substrate. Permanent magnets for generating magnetic field were disposed on both sides of the glass substrate so that a 40 kA/m unidirectional magnetic field could be applied to the glass substrate.

Figure 2:
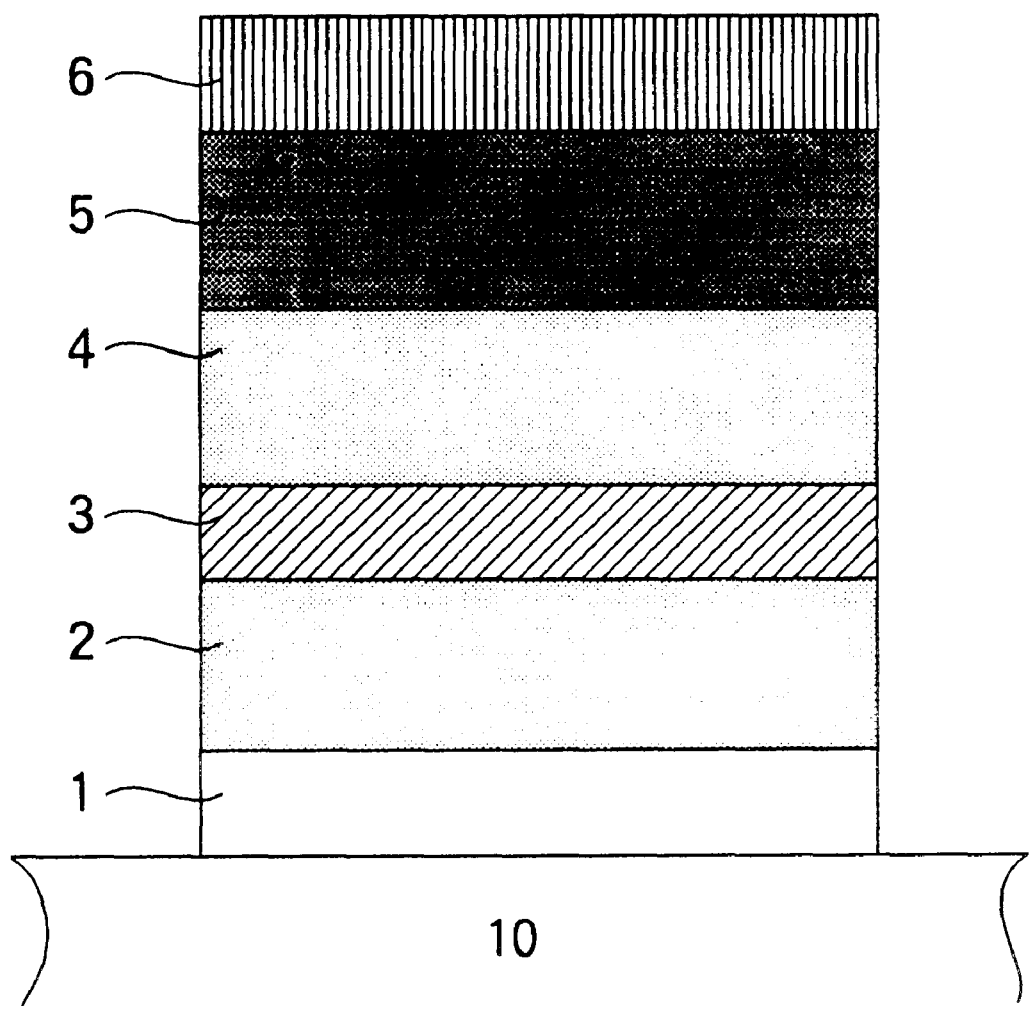
FIG. 2 is a diagram of assistance in explaining the construction of a typical spin-valve type multi-layered thin film.

A multi-layered thin films as shown in FIG. 2 was prepared using the ion beam sputtering apparatus. A 5 nm-thick Ta underlayer, a first ferromagnetic layer (a 7 nm-thick $Ni_{81}$—$Fe_{19}$ (atomic %) ferromagnetic film and a 2 nm-thick Co film), a 2 nm Cu non-magnetic layer, a second ferromagnetic layer (a 2 nm-thick Co film and a 5 nm-thick $Ni_{81}$—$Fe_{19}$ (atomic %) ferromagnetic film), and a 10 nm-thick $Fe_{50}$—$Mn_{50}$ anti-ferromagnetic layer were formed. In addition, a 5 nm-thick Ta layer was formed as a protective layer. The substrate temperature was kept constant during film formation by water-cooling the lower part of the substrate.

Figure 9:
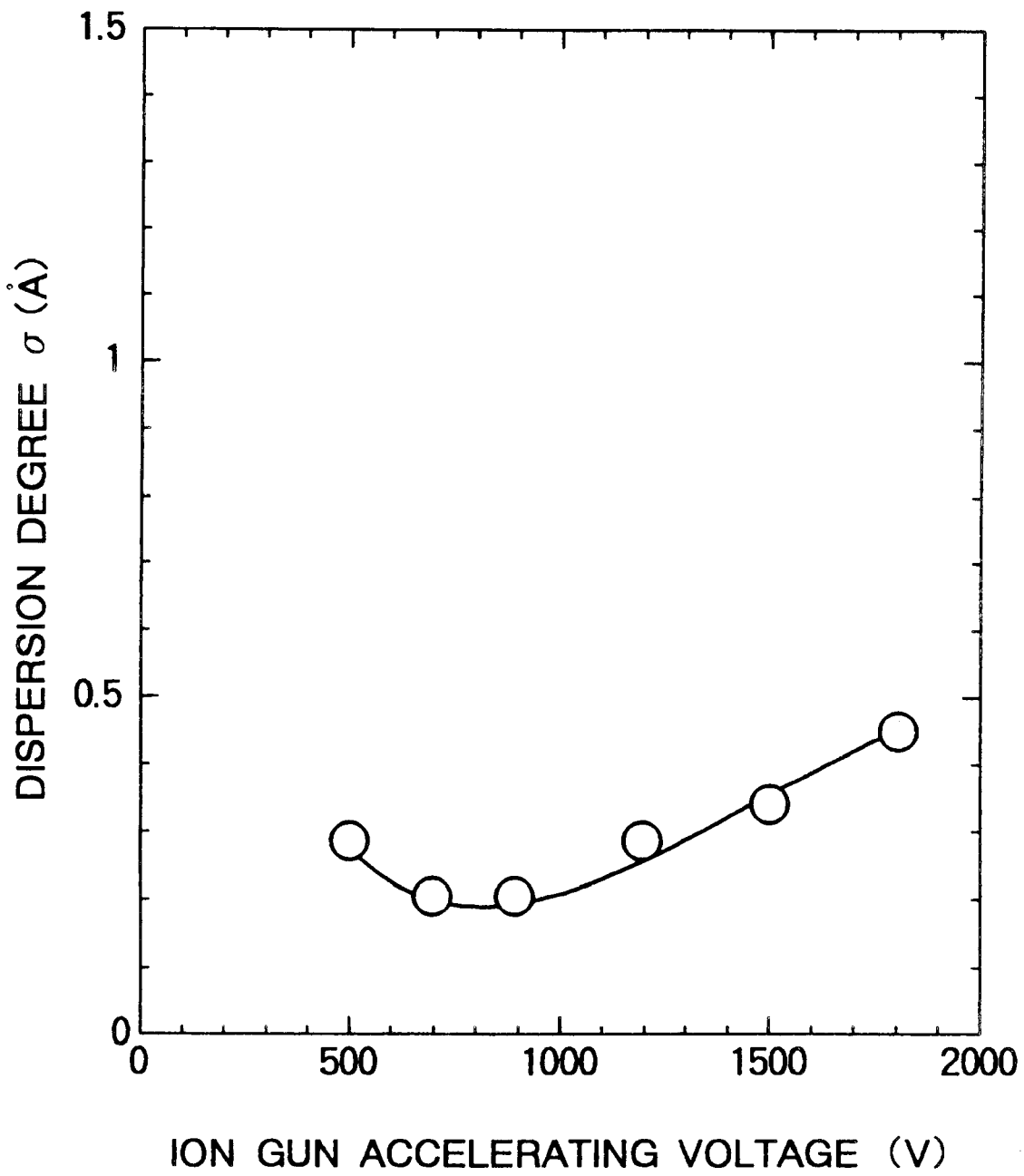
FIG. 9 is a diagram illustrating the relationship between the accelerating voltage of the ion gun and the degree of dispersion, $\alpha$, of lattice spacing at the interface between the anti-ferromagnetic layer and the second ferromagnetic layer.

Conditions for forming multi-layered thin films were such that Ar gas was introduced into the ion gun section to evacuate the vacuum chamber to a pressure of $4 \times 10^{-2}$ Pa, and the accelerating voltage of the ion gun was changed from 500V to 1800V at an ion current of 6 mA. During the process, no voltage was applied to an auxiliary ion gun. The degree of dispersion of the lattice spacing on the interface of the second ferromagnetic layer and the $Fe_{50}$—$Mn_{50}$ anti-ferromagnetic layer of the multi-layered magneto-resistive thin film thus obtained was calculated with the X-ray diffraction profile analysis method. The relationship between accelerating voltage and the degree of dispersion is shown in FIG. 9.

Figure 10:
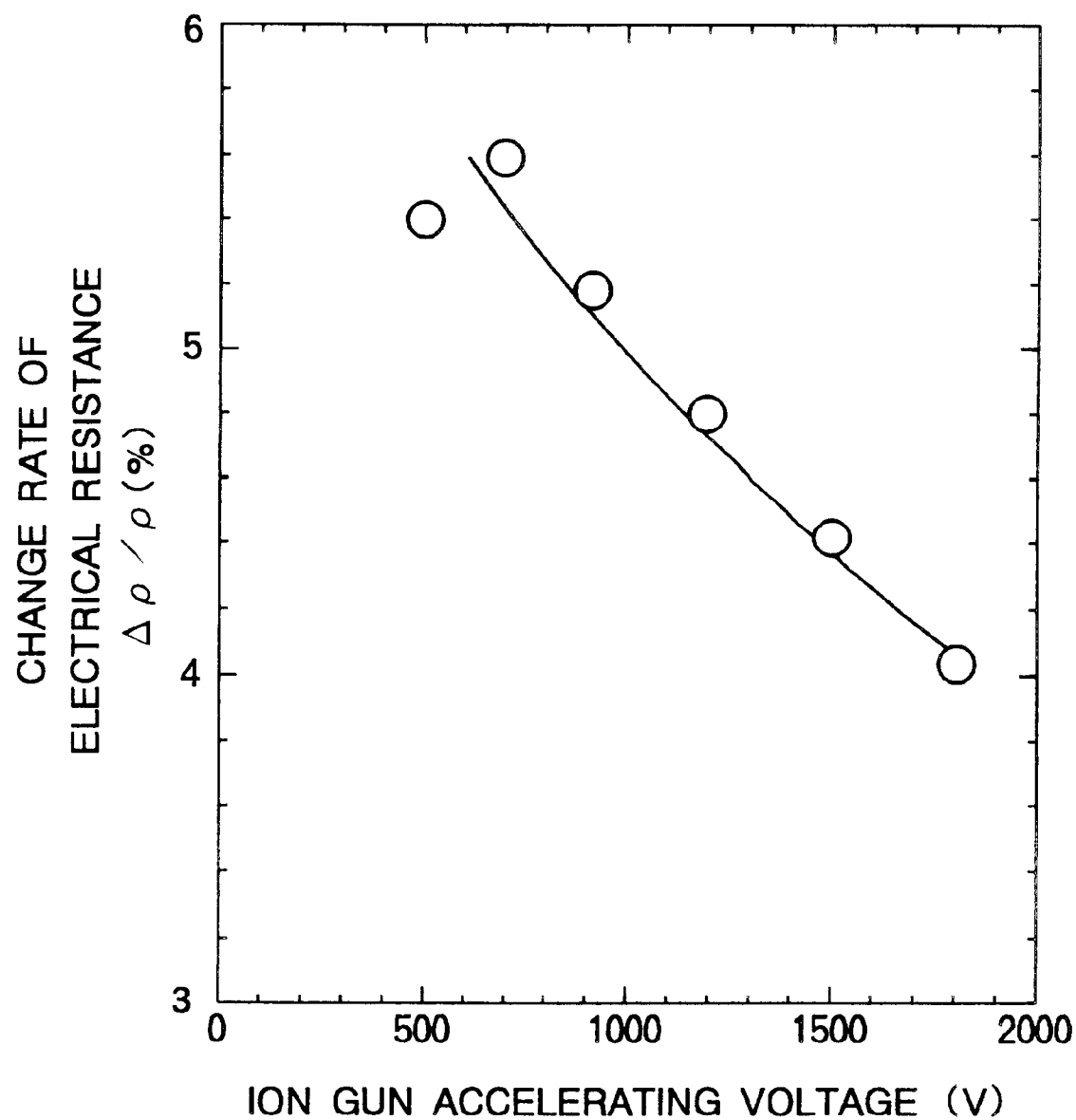
FIG. 10 is a diagram illustrating the relationship between the accelerating voltage of the ion gun and the change rate of electrical resistance, $\Delta\rho/\rho$, when a magnetic field is applied.

The change rate of electrical resistance, $\Delta\rho/\rho$, when a magnetic field was applied to each specimen was measured. The change rate of electrical resistance is defined here as the ratio of the amount of change of specific resistance, $\Delta\rho$, caused by the applied reversing magnetic field to specific electrical resistance, $\rho$. Specific resistance was measured with the 4-terminal method by applying a 1.6 kA/m, 50 Hz A-C magnetic field to the film surface of the specimen and feeding a 2 mA current. FIG. 10 shows the relationship between the accelerating voltage of the ion gun and the change rate of electrical resistance, $\Delta\rho/\rho$.

Figure 11:
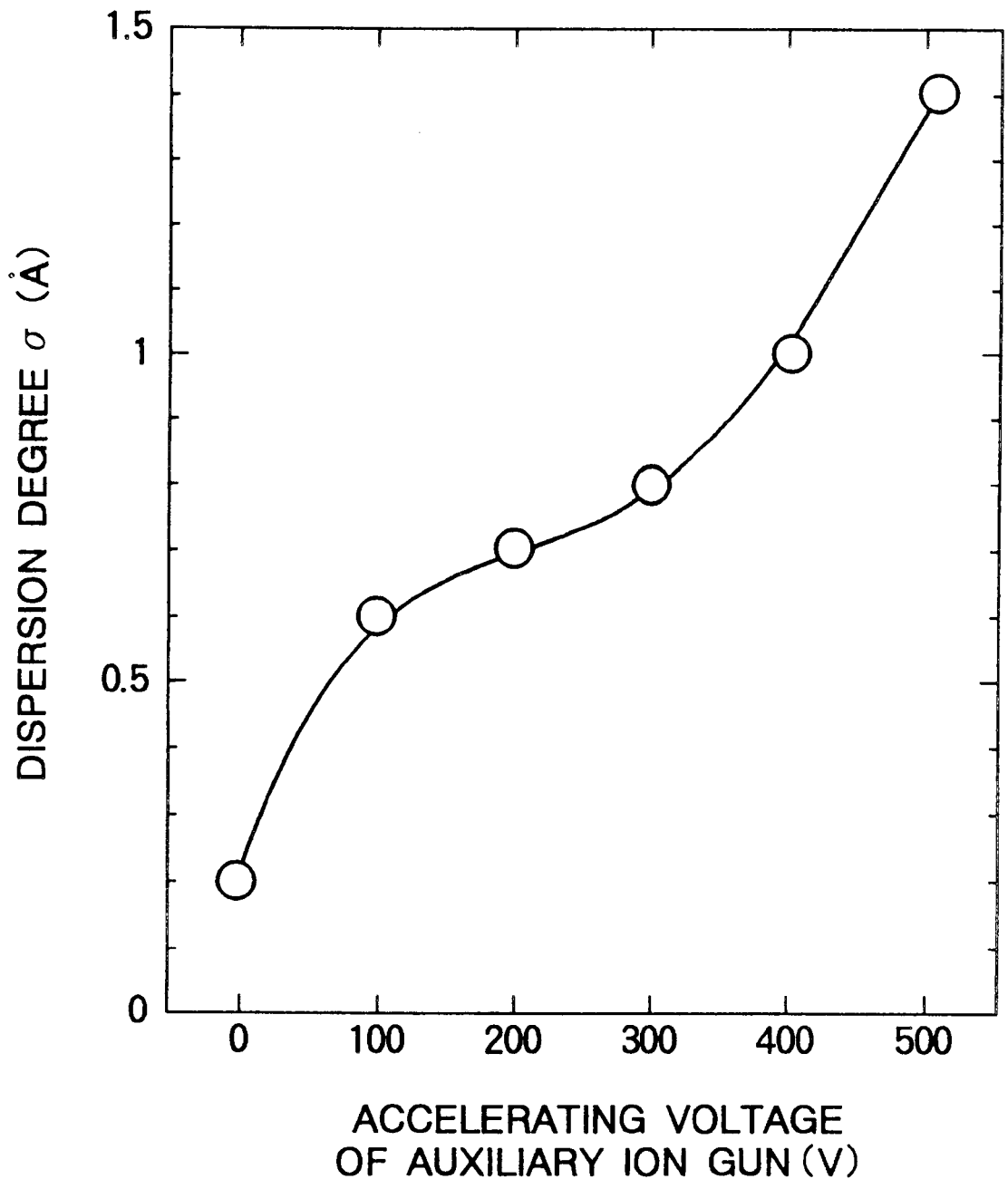
FIG. 11 is a diagram illustrating the relationship between the accelerating voltage of the auxiliary ion gun and the degree of dispersion, $\alpha$, of lattice spacing at the interface between the anti-ferromagnetic layer and the second ferromagnetic layer.
Figure 12:
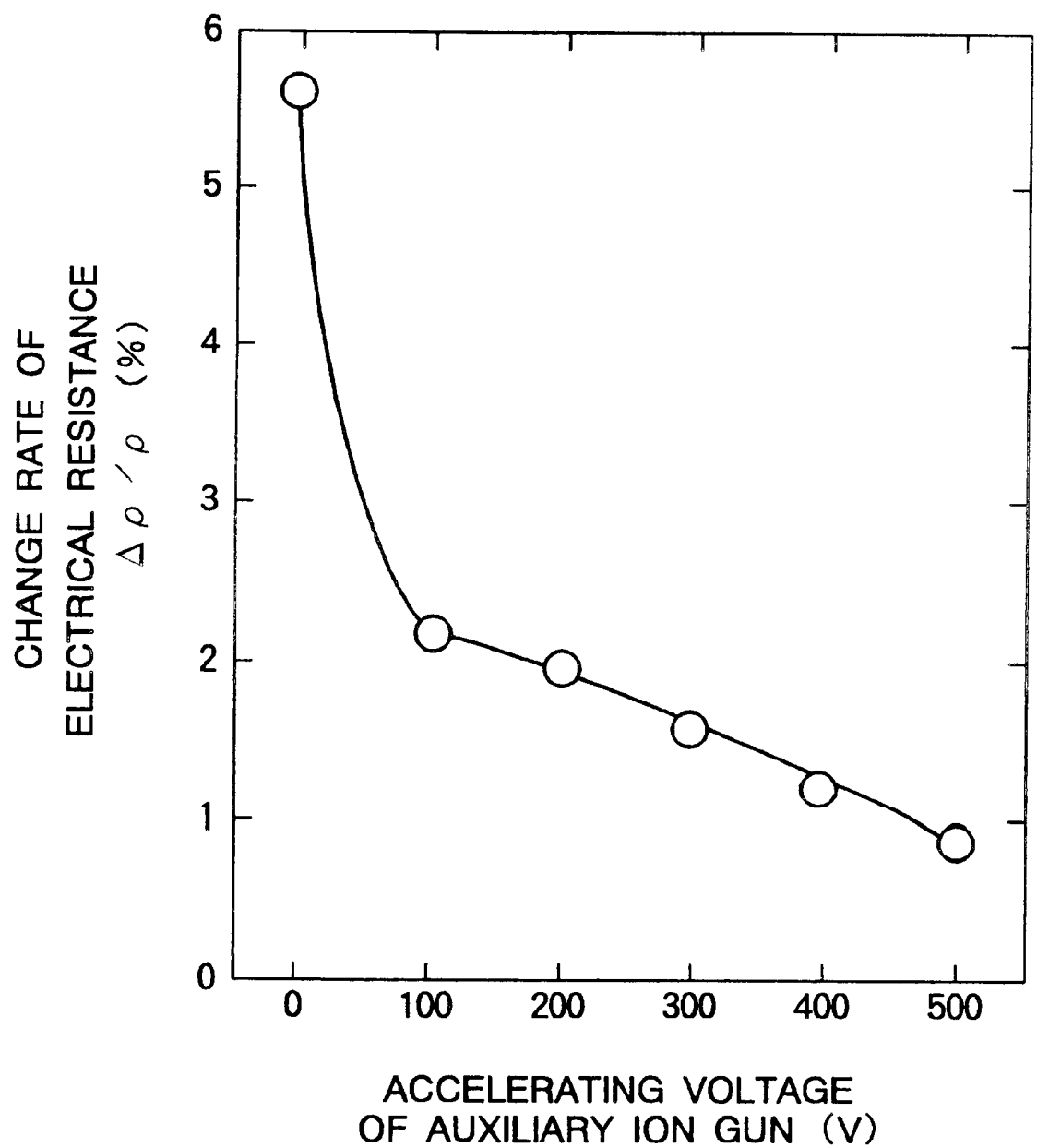
FIG. 12 is a diagram illustrating the relationship between the accelerating voltage of the auxiliary ion gun and the change rate of electrical resistance, $\Delta\rho/\rho$, when a magnetic field is applied.

Next, a multi-layered thin film was formed by evacuating the vacuum chamber to a vacuum of $6\times10^{-2}$ Pa and radiating Ar ions on the substrate while changing the accelerating voltage of the auxiliary ion gun from 0 to 500 V at the ion current of 4 mA, and keeping the accelerating voltage of the ion gun at 700 V at the ion current of 6 mA. The degree of dispersion of the lattice spacing at the interface of the second ferromagnetic layer and the $Fe_{50}$—$Mn_{50}$ layer of the multi-layered magneto-resistive thin film obtained was calculated from the X-ray diffraction measurement results in the same manner as described before. The relationship between the accelerating voltage of the auxiliary ion gun and the degree of dispersion is shown in FIG. 11. The relationship between the accelerating voltage of the auxiliary ion gun and the change rate of electrical resistance, $\Delta\rho/\rho$, of each specimen as measured in the same manner as described above is shown in FIG. 12.

Based on the above results, FIG. 1 shows the relationship between the degree of dispersion, $\alpha$, and the change rate of electrical resistance, $\Delta\rho/\rho$.

FIG. 1 indicates that the smaller the degree of dispersion of lattice spacing at the interface of the anti-ferromagnetic layer and the ferromagnetic layer, the more improved is the change rate of electrical resistance, $\Delta\rho/\rho$. When the degree of dispersion, $\alpha$, of crystal lattice spacing at the interface is high, on the other hand, sensitivity, that is, the change rate of electrical resistance, $\Delta\rho/\rho$, deteriorates.

In this embodiment, multi-layered thin films were manufactured using the ion beam sputtering apparatus. The use of any film forming methods other than the ion beam sputtering system can achieve similar effects. As a method of reducing the resistance value to improve the change rate of resistance, radiating ions on the substrate, or heating the substrate to a high temperature by providing means for applying a positive or negative substrate bias voltage during film formation with the r. f. or D.C. sputtering method is known. Such a method can have effects similar to ion radiation in the ion sputtering method.

What is claimed is:

1. A multi-layered magneto-resistive thin film comprising a first ferromagnetic layer and a second ferromagnetic layer laminated via an interposed non-magnetic layer on a substrate; the second ferromagnetic layer being laminated with an adjoining antiferromagnetic layer and the magnetizing direction of the second ferromagnetic layer being pinned by a magnetic exchange coupling field produced by the anti-ferromagnetic layer while the first ferromagnetic layer being not pinned, wherein the degree of dispersion $\alpha$ of lattice spacing at the interface of the two layers is equal to or less than 0.5 A with respect to the average value of $\frac{1}{2}(d_{ferro} + d_{anti-ferro})$ wherein $d_{ferro}$ and $d_{anti-ferro}$ express lattice spacings almost parallel to the film surfaces of the second ferromagnetic and the anti-ferromagnetic layers, respectively.

2. A multi-layered magneto-resistive thin film as set forth in claim 1 wherein the anti-ferromagnetic layer comprises a film composed chiefly of Fe—Mn whose (111) plane is oriented in parallel to the surface of the film.

3. A multi-layered magneto-resistive thin film as set forth in claim 2 wherein the first and second ferromagnetic layers are of a two-film construction comprising a film chiefly containing Ni—Fe whose (111) plane is oriented in parallel to the surface thereof and a Co film or an alloy film composed chiefly of Co with a density equivalent to Co.

4. A multi-layered magneto-resistive thin film as set forth in claim 2 wherein a non-magnetic layer comprises a metal chiefly containing Cu; the two interfaces thereof coming in contact with a Co film or an alloy film composed chiefly of Co having a density equivalent to Co.

* * * * *

UNITED STATES PATENT AND TRADEMARK OFFICE
CERTIFICATE OF CORRECTION

PATENT NO.: 5,914,597
DATED : June 22, 1999
INVENTOR(S): Shigeo Fujii, et al.

Page 1 of 2

It is certified that error appears in the above-identified patent and that said Letters Patent is hereby corrected as shown below:

Title Page, [57] ABSTRACT, line 3, change "magento-resistive" to --magneto-resistive--.

Column 2, line 35, change "ferromagneic" to --ferromagnetic--;
line 40, change "$a$" to --$\sigma$--;
line 49, change "$a$" to --$\sigma$--.

Column 3, line 16, change "$a$" to --$\sigma$--;
line 24, change "$a$" to --$\sigma$--;
line 46, after "thereof" insert --.--.

Column 4, line 25, change "$a$" to --$\sigma$--;
line 26, change "$a$" to --$\sigma$--;
line 29, change "$a$" to --$\sigma$--;
line 49, change "$a$" to --$\sigma$--;
line 59, change "$a$" to --$\sigma$--.

UNITED STATES PATENT AND TRADEMARK OFFICE
CERTIFICATE OF CORRECTION

PATENT NO.: 5,914,597
DATED : June 22, 1999
INVENTOR(S): Shigeo Fujii, et al.

It is certified that error appears in the above-identified patent and that said Letters Patent is hereby corrected as shown below:

Column 5, line 25, change "$f_{78}$" to $f_k$--;
line 44, change "$a$" to --$\sigma$--;

Column 6, lines 7, 9, 11, 15, and 17, change change "$a$" to --$\sigma$--.

Column 7, lines 18 and 24, change "$a$" to --$\sigma$--.

Column 8, line 11, change "$a$" to --$\sigma$--.

Signed and Sealed this

Twenty-first Day of December, 1999

Q. TODD DICKINSON

*Attest:*

*Attesting Officer*       *Acting Commissioner of Patents and Trademarks*